United States Patent [19]

Aoki et al.

[11] 4,150,282

[45] Apr. 17, 1979

[54] DETECTOR FOR BIDIRECTIONAL MOVEMENT OF AN EXTENSIBLE MEMBER IN AN ELECTRONIC DIGITAL SCALE

[75] Inventors: Junji Aoki, Kashiwara; Tetsuo Iwase, Yamatokoriyama, both of Japan

[73] Assignee: Sharp Kabushiki Kaisha, Osaka, Japan

[21] Appl. No.: 845,792

[22] Filed: Oct. 26, 1977

[30] Foreign Application Priority Data

Oct. 28, 1976 [JP] Japan .......................... 51/145641[U]

[51] Int. Cl.² .......................... G06M 3/14; G01B 3/12
[52] U.S. Cl. ................................. 235/92 DN; 33/139; 235/92 EV; 235/92 MP; 235/92 V; 235/92 R
[58] Field of Search .......... 235/92 DN, 92 MP, 92 V, 235/92 PB, 92 EV; 364/561, 562; 33/140, 137 R, 139; 250/561, 209

[56] References Cited

U.S. PATENT DOCUMENTS

| | | | |
|---|---|---|---|
| 3,793,508 | 2/1974 | Maggi | 235/92 V |
| 3,811,648 | 5/1974 | Ream et al. | 235/92 MP |
| 4,031,360 | 6/1977 | Soule | 235/92 MP |

OTHER PUBLICATIONS

"Accumulating Digitizer System", Fields & Findley, Review of Scientific Instruments, vol. 31, No. 12, pp. 1312-1317, Dec. 1960.

*Primary Examiner*—Joseph M. Thesz
*Attorney, Agent, or Firm*—Birch, Stewart, Kolasch & Birch

[57] ABSTRACT

An extensible tape member is provided to extend along an object to be measured, and to permit a detection plate to rotate in unison with the pulling in and out movement of the extensible member. A pair of photoelectric elements is positioned with respect to the detection plate for developing detection signals in accordance with rotation of the detection plate. The detection signals are developed as a function of an amount of the extension of the tape member and the direction of the tape extension. The detection signals derived from the pair of the elements have a phase difference with respect to each other so as to determine whether the extensible tape member is being pulled out or in the housing of the digital scale, that is, the direction of the extension of the tape member. The detection signals are introduced into a logic circuit for developing control signals which are supplied to a display driver. The driver excites a display which provides an indication of distance information responsive to measured length.

18 Claims, 7 Drawing Figures

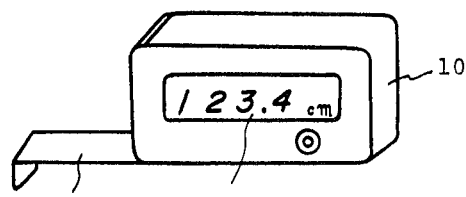
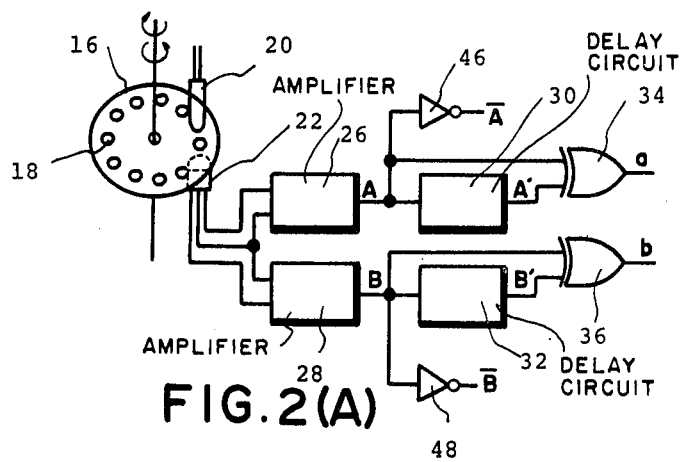
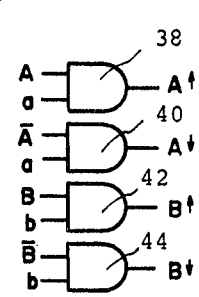
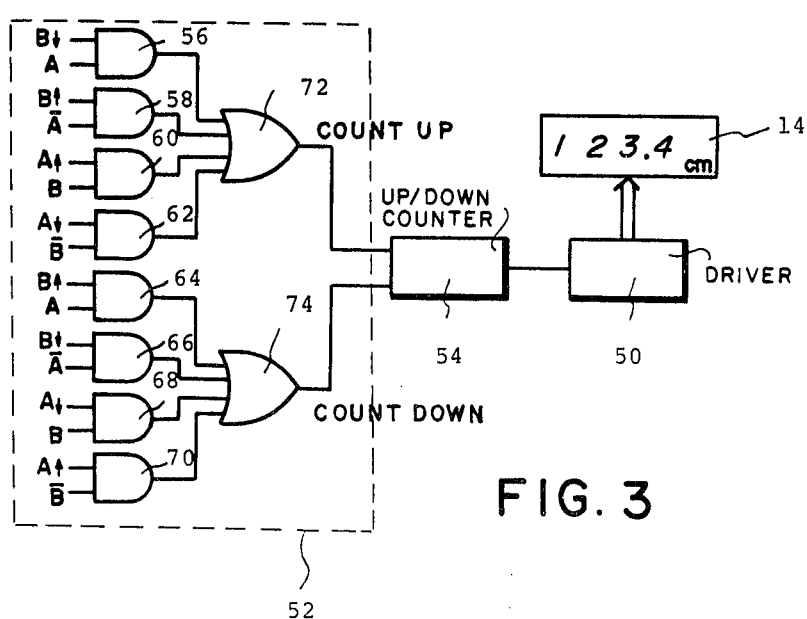

DETECTOR FOR BIDIRECTIONAL MOVEMENT OF AN EXTENSIBLE MEMBER IN AN ELECTRONIC DIGITAL SCALE

BACKGROUND OF THE INVENTION

The present invention relates to an electronic digital scale, wherein a length is measured through the movement of an extensible member and then is indicated on a digital display after being processed by a detection circuit.

In the art of measurements, a single vehicle, for example, a sprocket was provided to detect the length of extension of an extensible tape member, which was rotated in union with the movement of the tape member. See, for example, U.S. Pat. No. 3,526,890, entitled "LINEAR TAPE TRANSDUCER" assigned to Anilam Electronics Corporation. However, such a detection system required at least two sprockets to measure the bidirectional movement of the extensible tape member. This made an electronic digital scale unavoidably complex.

OBJECTS AND SUMMARY OF THE INVENTION

Accordingly, an object of the present invention is to provide an improved electronic digital scale which minimizes the shape and size of the digital scale thereof.

Another object of the present invention is to provide an improved electronic digital scale which detects movement into and out of the housing of the electronic digital scale of an extensible tape member.

To achieve the above objectives, pursuant to an embodiment of the present invention, an extensible tape member is adjusted to an object to be measured by pulling it out of the housing of the electronic digital scale. When the amount of the extended tape member exceeds the length of the object being measured, it is also necessary to pull the tape member back into the housing of the scale in order to position the extended tape member in an accurate position.

A detection disc is provided for rotation in unison with the pull-out movement and the draw-in movement of the tape member. Two photo detectors each comprising a light emitting element and a light sensing element are positioned associated with the detection disc. The photo detectors detect the number of light beams passing through holes formed in the detection disc as it rotates. Detection signals are provided by the photo detectors for developing information representative of both the number of light beams passing through the detection disc and the direction of rotation of the detection disc which in turn correspond to the traveled distance and the traveled direction of the tape member, respectively. The detection signals have a phase shift of approximately 90° from each other. The traveled direction of the tape member is determined through the use of the phase relationship of the detection signals. This is because the phase relationship of the detection signals are varied in accordance with the pull-out movement and the pull-in movement of the tape member.

A detection circuit is provided for determining the occurrence of the detection signals, which comprises a logic circuit for developing a count up signal and a count down signal upon the introduction of the detection signals. Information signals are generated through the use of the count up signal and the count down signal for driving a display. The information signals corresponds to the pull-out movement and the pull-in movement of the tape member, whereby distance information of the extended distance of the tape member is indicated on the display.

BRIEF DESCRIPTION OF THE DRAWINGS

The present invention will become more fully understood from the detailed description given hereinbelow and the accompanying drawings which are given by way of illustration only, and thus are not limitative of the present invention and wherein, FIG. 1 is a perspective view of an electronic digital scale of an embodiment of the present invention;

FIGS. 2(A), 2(B) and 3 are block diagrams of a detector included within the electronic digital scale shown in FIG. 1, respectively;

DESCRIPTION OF THE PREFERRED EMBODIMENTS

Figure 4:
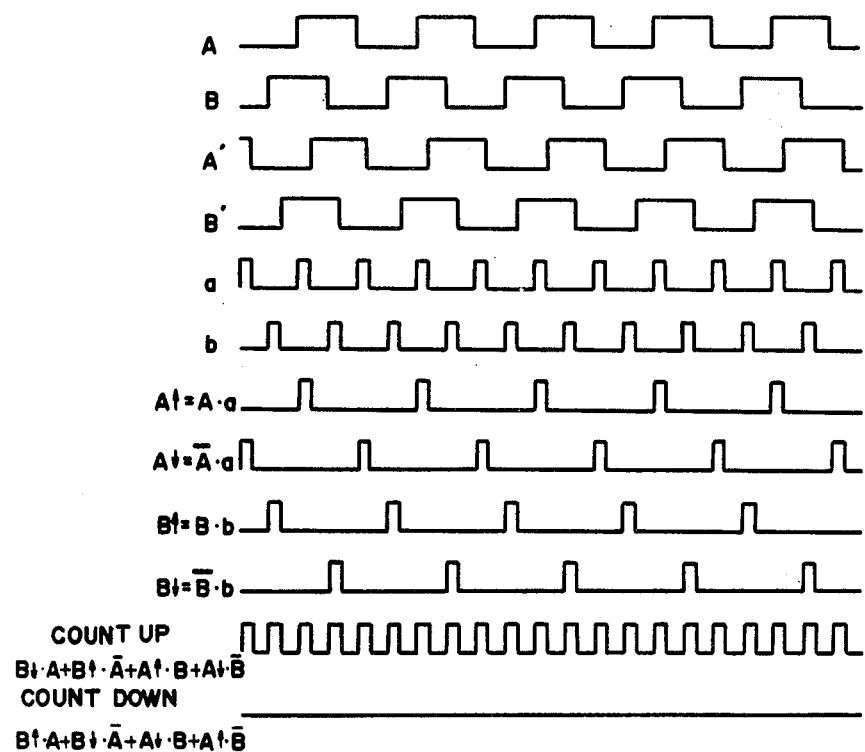
FIGS. 4 and 5 are time charts of various signals occurring within the detector shown in FIGS. 2(A), 2(B), and 3, respectively.

FIG. 1 shows an electronic digital scale 10 of an embodiment of the present invention which comprises an extensible tape member 12 for extending into and out of the housing of the electronic digital scale 10 along an object to be length-measured, and a display 14 for visually indicating measurement results obtained via the extensible tape member 12.

FIGS. 2(A), 2(B) and 3 show a detector assembly of the electronic digital scale 10 for measuring the amount of movement of the extensible tape member into and out of the housing of the electronic digital scale 10.

The detector assembly mainly comprises a detection disc 16 having a plurality of holes 18, a light emitting element 20 for releasing a beam of light, a light receiving element 22 for receiving the light beam to detect the number of the light beams passing through the holes 18 and to provide counting signals for a detector circuit incorporated within the detector assembly for determination purposes.

The detection disc 16 is rotated in unison with the movement of the extensible tape member 12 into and out of the housing of the electronic digital scale 10. The light emitting element 20 constantly provides the light beams for the detection disc 16 while the electronic digital scale 10 is operating. The light can pass through the holes 18 formed in the detection disc 16 and then reach the light receiving element 22. The light receiving element 22 develops a pair of sensing signals which are not of a predetermined phase (for example, 90 degrees). The sensing signals are produced out of phase due to the fact that the two light receiving elements 22 are physically shifted to one half of the length of each sensing element, with respect to each other. The sensing signals are generated at an approximately constant frequency in spite of the velocity of the detection disc 16. This is true because the holes on the disc are spaced apart at equal intervals. Therefore, in spite of the higher velocity of rotation, the light is received by the receiving element at the same point in time.

Figure 6:
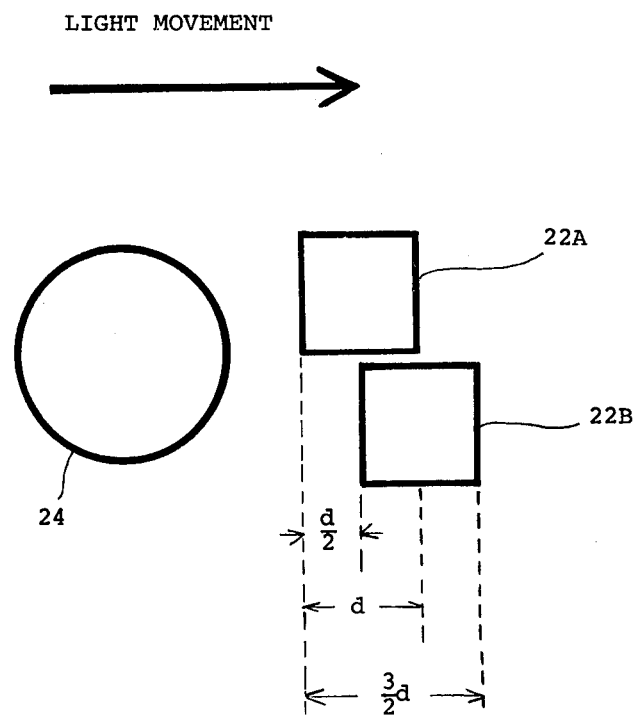
FIG. 6 is a plan view of movement of a light beam relative to photo detectors included within the detector shown in FIG. 2(A).

Therefore, the time periods of the sensing signals are independent of the rotation velocity of the disc 16 and the number of rotations of the disc 16. FIG. 6 shows by way of example a more specific layout of two light receiving elements 22A and 22B such as phototransistors, with respect to a lighting spot 24 from the light emitting element 20. As stated above, the 90° phase difference between sensing signals are generated due to the relative positions of the light sensing elements 22A and 22B. The lighting spot 24 moves towards the sensing elements 22A and 22B. The sensing elements 22A and 22B are disposed d/2 apart from each other, wherein d is the full length of the sensing elements 22A and 22B which are in the shape of a square. The above shift amount is selected by changing the relative positions of the light sensing elements 22A and 22B and the 90° phase shift difference is most preferable to ensure accuracy of light beam detection. The sensing signals are applicable to length detection purposes under the condition that the rising edge of a sensing signal is not in agreement with the trailing edge of the other sensing signal and then the trailing edge of the one sensing signal is not in agreement with the rising edge of the other sensing signal.

It is not necessary to mount the light sensing elements 22A and 22B on a same substrate to achieve accurate detection. Therefore, it is possible to separately arrange the light sensing elements 22A and 22B so that the sensing signals are phase shifted by predetermined degrees, for example, 90 degrees. The light sensing elements 22A and 22B when mounted on the same substrate assure high reliability against variations in the environmental temperature because of the same temperature characteristics thereof.

Figure 5:
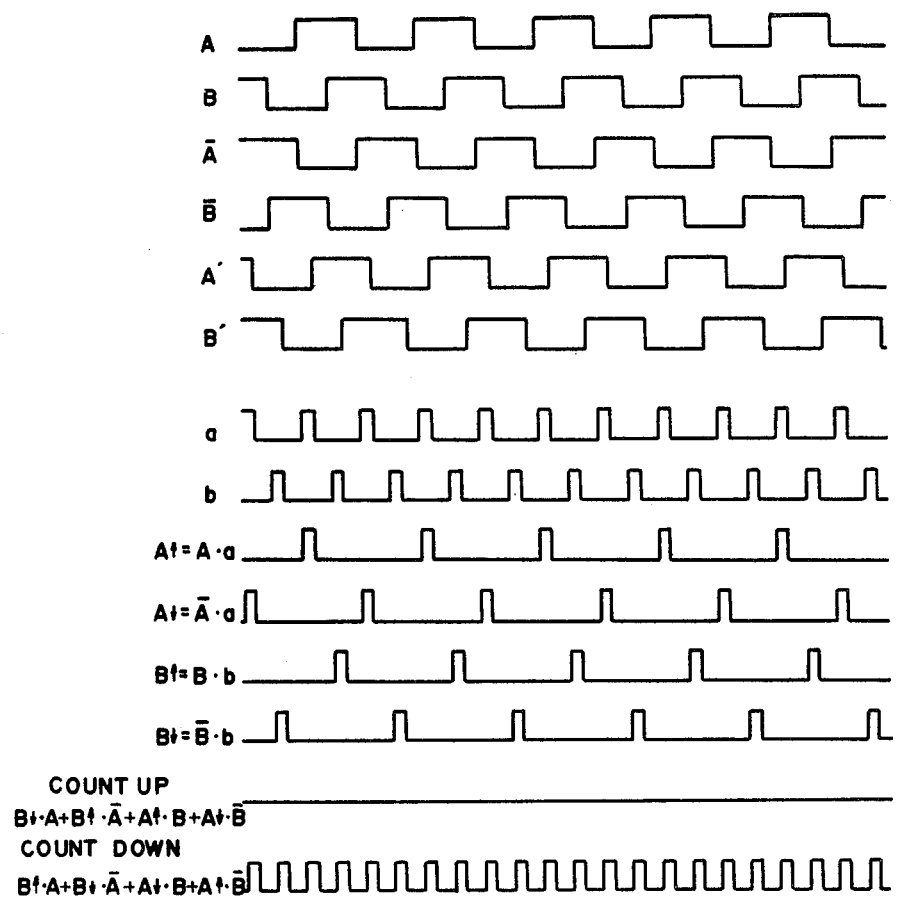

Under these circumstance, the sensing signals are introduced into amplifiers 26 and 28 which in turn provide the outputs A and B having the 90 degrees difference from each other. With respect to the phase difference between the detection signals A and B, FIGS. 4 and 5 show time charts of various signals occurring within the detector of the present invention. FIG. 4 illustrates detection signals A, B and various signals processed while the extensible tape member 12 is pulled out from the housing of the electronic digital scale 10. On the contrary, FIG. 5 shows the detection signals A, B and various signals processed when the extensible tape member 12 is moved back into the housing of the electronic digital scale 10. The detector of the present invention determines both the travelling distance by the tape member 12 and the direction of the tape member 12 through the use of the phase difference between the detection signals A and B. The detection circuit of the present invention is described with reference to FIGS. 2(A), 2(B), 3, 4 and 5. Attention is directed to FIGS. 2(A) and 4. The above-mentioned detection signals A, B are entered into delay circuits 30, 32 to provide signals A' and B'. The detection signal A and the signal A' are further introduced into an Exclusive-OR 34 to generate an edge signal a thereof. The detection signal B and the signal B' are also supplied into an Exclusive-OR 36 to develop an edge signal b.

FIG. 2(B) shows a control circuit for providing a rise signal A ↑ which represents the rising edge of the detection signal A, a fall signal A ↓ which corresponds to the trailing edge of the detection signal A, and a rise signal B ↑ and a fall signal B ↓ which are correspondence to the rising edge and the trailing edge the detection signal B, respectively.

The control circuit comprises four AND gates 38, 40, 42 and 44. The AND gate 38 provides the rise signal A ↑ through the use of the detection signal A and the edge signal a. The AND gate 40 generates the fall signal A ↓ by the edge signal a and an inversion signal $\bar{A}$ which is generated by an inversion 46 through the inversion of the detection signal A. Similarly, the AND gate 42 develops the rise signal B ↑ through the detection signal B and the edge signal b. The AND gate 44 generates the fall signal B ↓ through the edge signal b and an inversion signal $\bar{B}$ which is provided by an inverter 48 through the inversion of the detection signal B.

FIG. 3 illustrates the display 14, the driver 50 for exciting the display 14, and the detector circuit. The detector circuit 52 detects the traveling distance through the use of the tape member 12 and judges the extended direction of the tape member 12. The detector circuit comprises a generator logic 52 and an up/down counter 54. The detector operates as follows. The generator logic 52 develops count up signals and count down signals through the various signals. The count up and count down signals correspond to the traveling distance and the extended direction of the tape member 21, respectively. The generator logic 52 comprises eight (8) AND gates 56, 58, 60, 62, 64, 66, 68 and 70, and two (2) OR gates 72, 74.

The eight AND gates 56, 58, 60, 62, 64, 66, 68, 70 receive the following signals, respectively as shown in FIG. 3: the AND gate 56 is supplied with the fall signal B ↓ and the detection signal A; the AND gate 58 is supplied with the rise signal B ↑ and the inversion signal $\bar{A}$; the AND gate 60 is supplied with the rise signal A ↑ and the detection signal B; the AND gate 62 is supplied with the fall signal A ↓ and the inversion signal $\bar{B}$; the AND gate 64 is supplied with the rise signal B ↑ and the detection signal A; the AND gate 66 is supplied with the fall signal B ↓ and the inversion signal $\bar{A}$; the AND gate 68 is supplied with the fall signal A ↓ and the inversion signal $\bar{B}$; and the AND gate 70 is supplied with the rise siganl A ↑ and the inversion signal $\bar{B}$.

FIG. 4 illustrates time charts of the signal occurring within the detection circuit when the extensible tape member 12 is pulled out of the housing of the electronic digital scale 10. The count up signal is developed from the OR gate 72 while pulling out the tape member 12, whereas the count down signal from the OR gate 74 has no potential level, in other words, the ground level, whereby the movement is detected.

The OR gate 72 receives the output signals derived from the four AND gates 56, 58, 60 and 62 to provide the count up signal represented by the following formula when pulling out the extensible tape member 12.

$$B \downarrow \cdot A + B \uparrow \cdot \bar{A} + A \uparrow \cdot B + A \downarrow \cdot \bar{B} \tag{1}$$

Similarly, the OR gate 74 is supplied with the output signals from the four AND gates 64, 66, 68 and 70 and provides the count down signal which has no potential level, in other words, the ground level when pulling in tape member 12. The count down signal is represented by the following formula.

$$B \uparrow \cdot A + B \downarrow \cdot B + \bar{A} \downarrow \cdot B + A \uparrow \cdot \bar{B} \tag{2}$$

On the contrary, FIG. 5 shows the time charts of the signals occurring within the detection circuit when the extensible tape member 12 is drawn back into the housing of the electronic digital scale 10. Under the circumstance, the count up signal represented by the formula (1) is constantly at the ground level, whereas the count down signal formulated above. Therefore, the amount of the tape member 12 drawn back is detected.

The up/down counter counts 54 forwards and backwards upon the count up signal and the count down signal to detect the movement of the extensible tape member 12. The up/down counter 54 develops a control signal which is to be entered into the driver 50 for controlling the display 14. Therefore, the display 14 provides the distance indication corresponding to the traveled distance of the extensible tape member 12 pulled out and drawn back into the housing of the electronic digital scale 10.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic digital scale comprising:
   an extensible member for extending along an object to be measured;
   a detection signal generator means for generating detection signals upon movement of said extensible member, said generator being responsive to pull-out movement and pull-in movement of said extensible member;
   a detector assembly means for receiving said detection signals and providing control signals responsive to said movement of said extensible member, said detector assembly means comprising:
   means for generating edge signals corresponding to said detection signals,
   means responsive to said edge signals for generating rise and fall signals corresponding to a rising edge and a trading edge, respectively, of said detection signals,
   means responsive to said rise and fall signals for generating count-up and count-down signals, and
   output means responsive to said count-up and count-down signals to generate said control signals; and
   a display for providing an indication of said movement in response to said control signals.

2. The electronic digital scale set forth in claim 1, wherein said detector assembly means comprises:
   a logic circuit means for detecting the extended distance and direction of extension of said extensible member providing a count up signal responsive to said pull-out movement of said extensible member and a count down signal responsive to said pull-in movement of said extensible member.

3. The electronic digital scale set forth in claim 2, wherein said display means includes a driver; and
   said detector assembly means comprises:
   an up/down counter means responsive to said count up and count down signals to provide said control signals to said driver.

4. The electronic digital scale set forth in claim 2, wherein said logic circuit further comprises and AND gate responsive to said detection signals.

5. The electronic digital scale set forth in claim 2, wherein said logic circuit further comprises an OR gate responsive to a gated output of said detection signals.

6. The electronic digital scale set forth in claim 1, wherein said detection signal generator means comprises a plurality of light-sensing means, the spacing between each of said sensing means being so selected as to phase-shift said detection signals by predetermined degrees.

7. The electronic digital scale set forth in claim 6, wherein said detection signal is phase-shifted by 90 degrees.

8. The electronic digital scale set forth in claim 1, wherein said detection signal generator means comprises:
   a detection disc having a plurality of holes and an optically sensitive assembly, said detection disc being rotated in unison with said extensible member and wherein said optically sensitive assembly comprises a light emitting means for providing a beam of light applied to said detection disc and two light receiving and sensing means for receiving the light beam passing through the holes.

9. An electronic digital scale comprising:
   an extensible member for extending along an object to be measured;
   a detection signal generator means for generating detection signals having a predetermined phase difference in response to movement of said extensible member, said detection signal generator being responsive both to pull-out movement and pull-in movement of said extensible member;
   a detector assembly means for receiving said detection signals and providing control signals responsive to the movement of said extensible member;
   driver means for receiving the control signals; and
   a display means for providing an indication of the traveled movement of said extensible member, said display being operated by said driver.

10. The electronic digital scale set forth in claim 9, wherein said detector assembly means further comprises:
    a logic circuit means for processing said detection signals.

11. The electronic digital scale set forth in claim 10, wherein said logic circuit means provides:
    a count up signal for controlling the driver, said count up signal being generated by the pull-out movement of said extensible member, and a count down signal for controlling the driver, said count down signal being generated by the pull-in movement of said extensible member.

12. The electronic digital scale set forth in claim 11, wherein said detector assembly means further comprises:
    an up/down counter means for the control signals in response to said count-up and count-down signals.

13. The electronic digital scale set forth in claim 9, wherein said detection signal generator means comprises a plurality of light-sensing elements so spaced apart from each other as to phase-shift said detection signals by 90°.

14. An electronic digital scale comprising:
    an extensible member for extending along an object to be measured;
    a detection signal generator means for generating detection signals having a predetermined phase difference in response to movement of said extensible member, said detection signal generator being responsive both to pull-out movement and pull-in movement of said extensible member;
    a logic circuit means responsive to said detection signals for generating a count up signal corresponding to the pull-out movement of said extensible member and a count down signal corresponding to the pull-in movement of said extensible member;

an up/down counter means for providing distance correlated control signals responsive to said count up and the count down signals;

a driver means responsive to said control signals for providing enabling signals; and a display means responsive to said enabling signals from driver means for providing an indication of the extended distance of said extensible member.

15. The electronic digital scale set forth in claim 14, wherein said detection signal generator comprises at least two sensing elements so positioned within said generator as to develop phase-shifted detection signals, said phase shifted signals being 90° out of phase.

16. The electronic digital scale set forth in claim 14, wherein said logic circuit comprises an AND gate responsive to said detection signals.

17. The electronic digital scale set forth in claim 14, wherein said logic circuit comprises an OR gate responsive to a gated output of said detection signals.

18. The electronic digital scale set forth in claim 14, wherein said detection signal generator comprises a detection disc having a plurality of holes spaced apart thereon and an optically sensitive assembly, said detection disc adapted to be rotated in unison with said extensible member, said optically sensitive assembly further comprising a light emitting means for emitting detection light applied to said detection disc and two sensor means for receiving said detection light, said light passing through said detection holes on said detection disc.

* * * * *